US009432012B2

(12) United States Patent
Liu et al.

(10) Patent No.: US 9,432,012 B2
(45) Date of Patent: *Aug. 30, 2016

(54) DELAY LINE CIRCUITS AND SEMICONDUCTOR INTEGRATED CIRCUITS

(71) Applicant: VIA Alliance Semiconductor Co., Ltd., Shanghai (CN)

(72) Inventors: Quanfeng Liu, Beijing (CN); Huijie Duan, Beijing (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/607,230

(22) Filed: Jan. 28, 2015

(65) Prior Publication Data

US 2015/0349766 A1 Dec. 3, 2015

Related U.S. Application Data

(62) Division of application No. 14/587,628, filed on Dec. 31, 2014.

(30) Foreign Application Priority Data

May 29, 2014 (CN) .......................... 2014 1 0235939

(51) Int. Cl.
*H03K 5/14* (2014.01)
*H01L 27/092* (2006.01)
*H01L 23/528* (2006.01)

(52) U.S. Cl.
CPC ............... *H03K 5/14* (2013.01); *H01L 23/528* (2013.01); *H01L 27/092* (2013.01)

(58) Field of Classification Search
USPC ................ 327/276–278, 281, 283–285, 288, 327/564–565
See application file for complete search history.

(56) References Cited

U.S. PATENT DOCUMENTS

| 6,859,082 B2 * | 2/2005 | Tang ...................... H03K 5/133 327/276 |
| 7,139,990 B2 | 11/2006 | Singh et al. |
| 7,564,285 B2 | 7/2009 | Chang et al. |
| 7,982,517 B2 | 7/2011 | Kim |

(Continued)

FOREIGN PATENT DOCUMENTS

| TW | 200835137 | 8/2008 |
| TW | 201006133 | 2/2010 |

(Continued)

*Primary Examiner* — An Luu

(74) *Attorney, Agent, or Firm* — McClure, Qualey & Rodack, LLP

(57) ABSTRACT

A delay line circuit is provided and includes a fine delay unit and coarse delay units. Each fine delay circuit includes a first PMOS transistor; a first NMOS transistor; second PMOS transistors whose widths of gate features of the second PMOS transistor are equal; at least one third PMOS transistor, coupled between the power voltage and the source of the first PMOS transistor, whose width of gate features is smaller than the widths of the gate features of the second PMOS transistors, second NMOS transistors whose widths of gate features of the second NMOS transistors are equal; and at least one third NMOS transistor, coupled between the ground voltage and the source of the first NMOS transistor, whose width of gate features is smaller than the widths of the gate features of the second NMOS transistors.

14 Claims, 11 Drawing Sheets

(56) References Cited

U.S. PATENT DOCUMENTS

| | | |
|---|---|---|
| 8,593,197 B1 | 11/2013 | Cheng |
| 2010/0013533 A1 | 1/2010 | Lee et al. |
| 2014/0103985 A1* | 4/2014 | Andreev ............... H03K 5/131 327/262 |

FOREIGN PATENT DOCUMENTS

| | | |
|---|---|---|
| TW | 201103036 | 1/2011 |
| TW | 201411621 | 3/2014 |

* cited by examiner

FIG. 1 (related part)

FIG. 2 (related part)

FIG. 3 (related part)

FIG. 4 (related part)

US 9,432,012 B2

DELAY LINE CIRCUITS AND SEMICONDUCTOR INTEGRATED CIRCUITS

CROSS REFERENCE TO RELATED APPLICATIONS

This application is a division of U.S. patent application Ser. No. 14/587,628, filed Dec. 31, 2014, the entirety of which is incorporated by reference. This Application also claims priority of China Patent Application No. 201410235939.6, filed on May 29, 2014, the entirety of which is incorporated by reference herein.

BACKGROUND OF THE INVENTION

1. Field of the Invention

The invention relates to a delay line circuit, and more particularly to a delay line circuit for a system-on-chip.

2. Description of the Related Art

In a system-one-chip, there are a large number of circuits which are used to process the phase relationship between signals. Multi-bit digital coding is required to control the phase relationship. A delay line circuit can be applied to achieve this function. For example, a delay line circuit can be controlled by 7-bit digital coding, so as to achieve delay adjustment by increasing 0~127 delay steps for an input signal. Thus, the phase relationship between an output signal and a reference signal can be controlled.

FIG. 1 shows a conventional delay line circuit 10. The delay line circuit 10 comprises a fine delay unit FD, coarse delay units CD1~CD31, a dummy coarse delay unit DCD, and switches SW0~SW31. There are four sets of codes of a control signal inputted to the fine delay unit FD. Switch control signals C0~C31 are used to control the thirty-two (32) switches SW0~SW31 to be turned on or off. Only one switch is turned on every time. Accordingly, 128 coding values formed by seven (7) bits are represented by four (4) multiplied by 32 (4×32). The delay of the coarse delay units CDN are equal and 4 times the delay step of the fine delay unit FD.

FIG. 2 shows the circuit of the fine delay unit FD. The fine delay unit FD comprises P-type metal oxide semiconductor (PMOS) transistors P1~P10 and N-type metal oxide semiconductor (NMOS) transistors N1~N10 which are coupled in the connection shown in FIG. 2. The PMOS transistor P9 and the NMOS transistor N9 are coupled together as an inverter. The PMOS transistors P1~P4 are coupled in parallel between the source of the PMOS transistor P9 and a power voltage DVDD. The gate of the PMOS transistor P1 is coupled to a ground voltage DVSS. The gates of the PMOS transistors P2~P4 are coupled to control signals SP0~SP2 respectively. The NMOS transistors N1~N4 are coupled in parallel between the source of the NMOS transistor N9 and the ground voltage DVSS. The gate of the NMOS transistor N1 is coupled to the power voltage DVDD. The gates of the NMOS transistors N2~N4 are coupled to control signals SN0~SN2 respectively. For example, when the control signal SP0 is 0, the control signal SN0 is 1; when the control signal SP1 is 1, the control signal SN1 is 0. The connection of the PMOS transistors P5~P8 is the same as the aforementioned connection of the PMOS transistors P1~P4, while the connection of the NMOS transistors N5~N8 is the same as the above connection of the NMOS transistors N1~N5, thus the related omitted description is omitted here. The fine delay unit FD achieves the delay change by controlling the PMOS transistors P2~P4 and P6~P8 and the NMOS transistors N2~N4 and N6~N8 to be turned on or off. For example, when the control signals SP0~SP2 are 1 and the control signals SN0~SN2 are 0, the delay of the fine delay circuit FD is minimum; when control signals SP0~SP2 are 1 and the control signals SN0~SN2 are 0, the delay of the fine delay circuit FD is maximum.

FIG. 3 shows the circuit of the coarse delay unit CD1. The circuit structures of the coarse delay units CD2~CD31 are the same as those of the coarse delay unit CD1, thus the related description is omitted here. The coarse delay unit CD1 comprises PMOS transistors P11~P14 and NMOS transistors N11~N14. In the coarse delay unit CD1, the delay of the coarse delay unit CD1 changes to be four times the delay step of the fine delay unit FD by adjusting the respective sizes of the transistors.

Generally, in order to ensure the uniformity of the delay steps, a fine delay unit FD and thirty-one coarse delay units CD1~CD31 are arranged by a straight line in the circuit layout, to guarantee that the loads of the delay units are equal. There are three critical factors for the uniformity of the delay steps. First, the delay steps of the fine delay unit FD are equal, which can be achieved by adjusting the sizes of the transistors in the fine delay unit FD repeatedly. FIG. 4 shows a partial circuit layout 40 of the fine delay unit FD in FIG. 2. In FIG. 4, a circuit layout a part of the transistors in the first-stage circuit of the fine delay unit FD (that is the PMOS transistors P1~P4 and P9 and the NMOS transistors N1~N4 and N9) is presented. The connection between the drains is not shown in FIG. 4. In order to ensure the accurate uniformity of the delay steps, the sizes of the PMOS transistors P1~P4 are different. This circuit layout may make the parasitical capacitance of the drains of the PMOS transistors P1~P4 to be larger. Second, the delay steps of the coarse delay units have to be precisely four times the delay step of the fine delay unit. The delay step of the fine delay unit changes by turning on or off the switch, while the delay steps of the coarse delay units are fixed absolute delay steps. Since the delay of the fine delay unit FD and the delays of the coarse delay units CDN are generated in different ways, the multiple relationships therebetween cannot be achieved accurately, particularly when different power voltages and temperatures are involved. Third. the fine delay unit FD and the coarse delay units CD1~CD31 are arranged in a straight line in the circuit layout, however, this makes the circuit layouts of the internal module of the SOC complicated and wastes space, particularly, for 28 nm processes or advanced processes which require that polysilicons of all core transistors are arranged in the same direction. Thus, the flexibility of the layout of the delay line circuit is greatly reduced. In other words, different designs are required for different delay line circuits, which increases the cost.

BRIEF SUMMARY OF THE INVENTION

It is desirable to provide a delay line circuit which has a shorter design period, has uniform delay steps, and is less affected by the temperature and voltage, and which can be disposed in SOCs flexibly.

An exemplary embodiment of a delay line circuit is provided. The delay line comprises a fine delay unit having an input terminal coupled to an input terminal of the delay line circuit and an output terminal coupled to an output terminal of the delay line circuit through a switch, and a coarse delay units coupled to the output terminal of the fine delay unit in series, wherein the coarse delay unit is coupled to the output terminal of the delay line circuit through a corresponding one of a plurality of first switches. The fine delay unit comprises a fine delay circuits, and the fine delay circuit comprises: a plurality of second PMOS transistors coupled between a power voltage and a source of the first PMOS transistor in parallel, wherein widths of gate features of the second PMOS transistor are equal, at least one third PMOS transistor coupled between the power voltage and the source of the first PMOS transistor, wherein a width of gate features of the at least one third PMOS transistor is smaller than the widths of the gate features of the second PMOS transistors, a plurality of second NMOS transistors coupled between a ground voltage and a source of the first NMOS transistor, wherein widths of gate features of the second NMOS transistors are equal, and at least one third NMOS transistor coupled between the ground voltage and the source of the first NMOS transistor, wherein a width of gate features of the at least one third NMOS transistor is smaller than the widths of the gate features of the second NMOS transistors.

An exemplary embodiment of a semiconductor integrated circuit is further provided. The semiconductor integrated circuit comprises a plurality of core transistors and a circuit module. Gate features of the core transistors are arranged in parallel. The circuit module comprises a plurality of semiconductor devices. The semiconductor devices are arranged in the same direction, and a circuit layout of the circuit module is presented as a square.

The provided circuit layout of the delay line circuit is a square. Thus, the circuit module can be flexibly applied in any position in SOC layouts, particularly, for 28 nm processes or advanced processes which require that polysilicons of transistors are arranged in the same direction, and the design period can be shortened. Moreover, the delay line circuit with a square circuit layout has an advantage of the equal widths of the polysilicons on the different rows. The provided delay line circuit further comprises a fine unit which can ensure the uniform delay steps and is less affected by the temperature and voltage.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
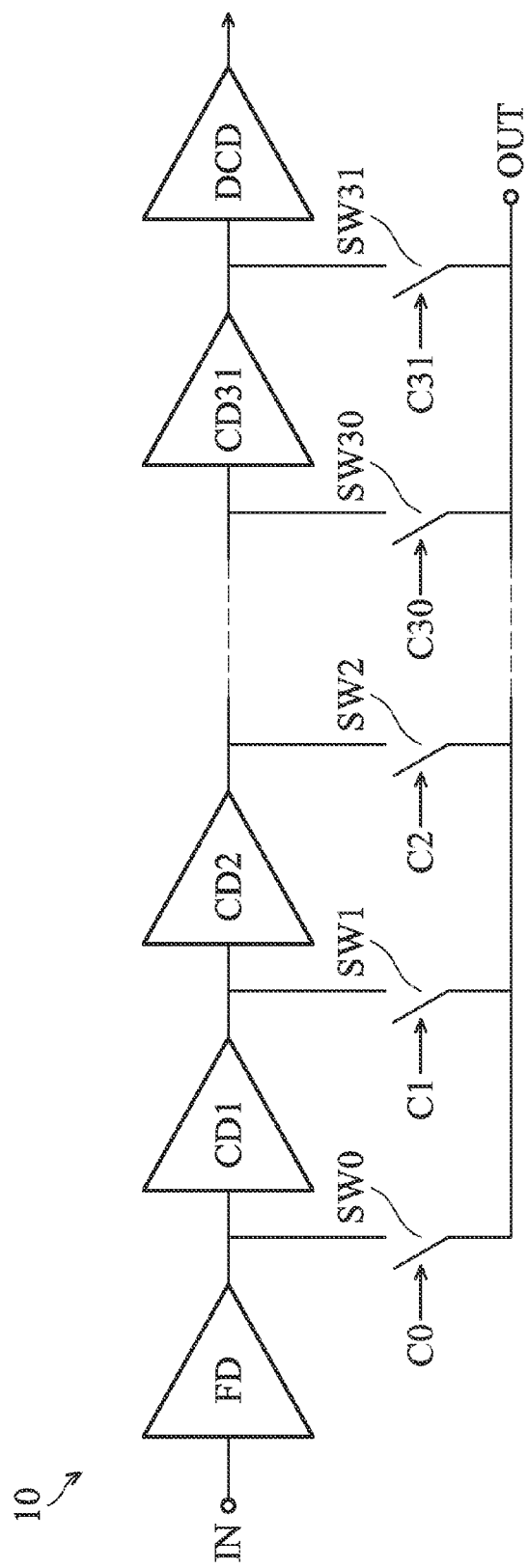
FIG. 1 shows a conventional of a delay line circuit.
Figure 2:
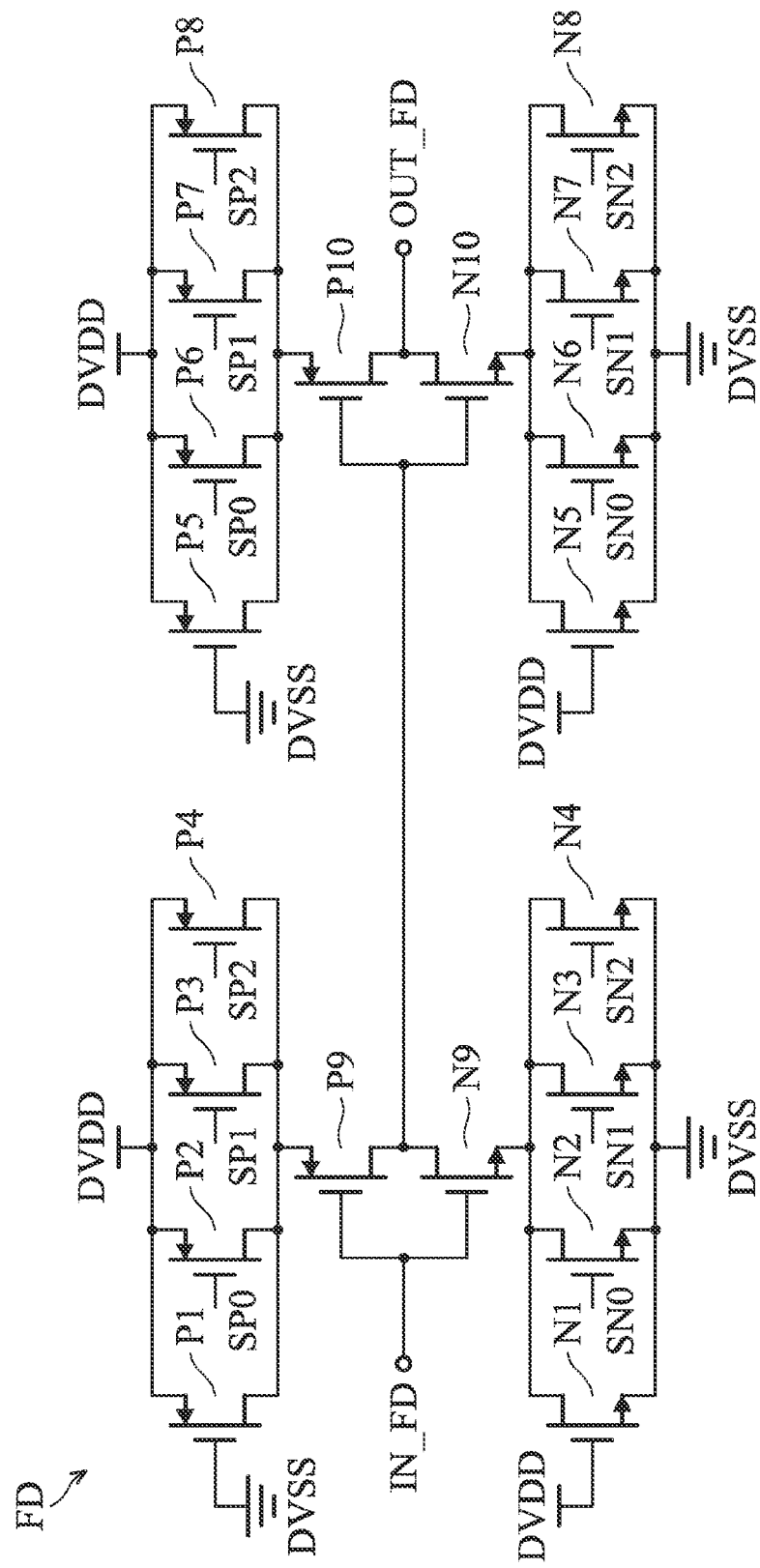
FIG. 2 shows a conventional fine delay unit of the delay line circuit in FIG. 1.
Figure 3:
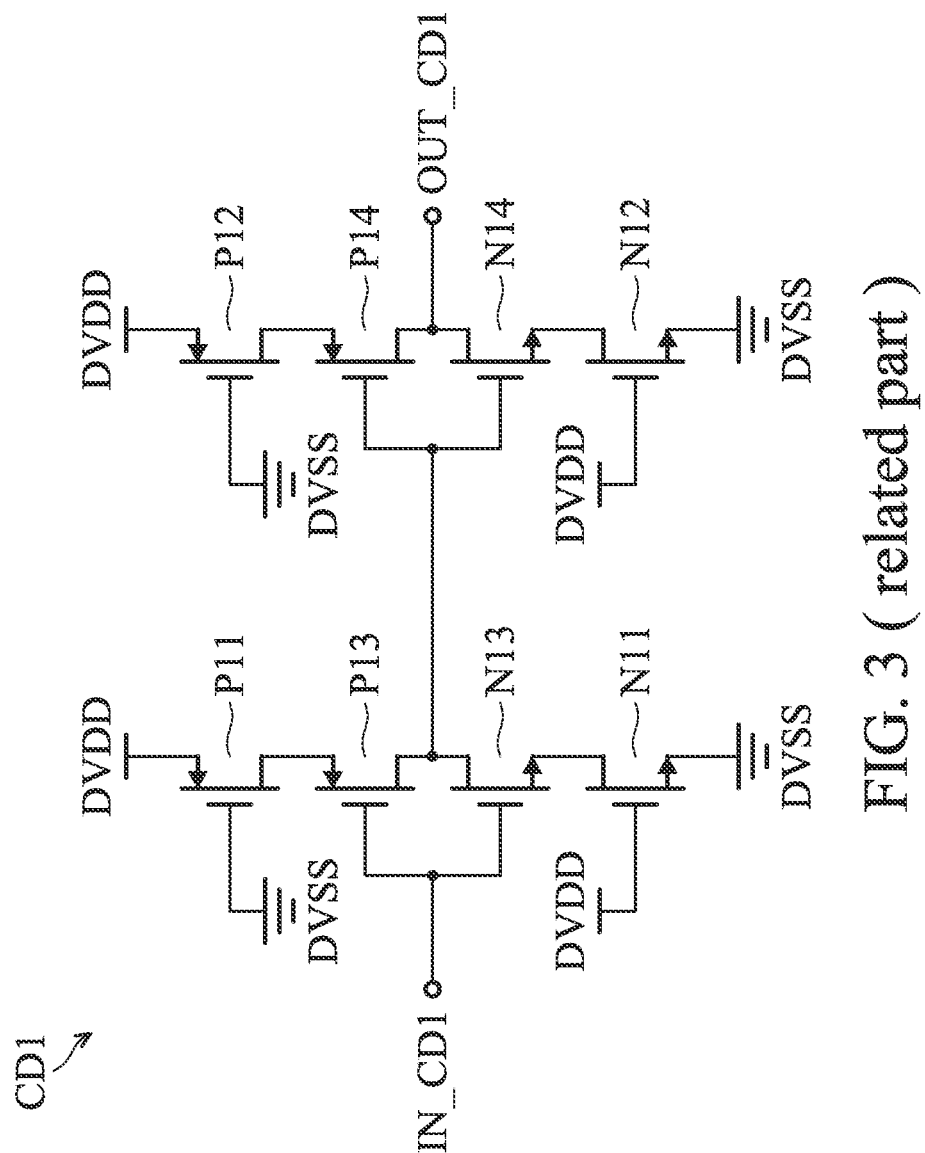
FIG. 3 shows a conventional coarse delay unit of the delay line circuit in FIG. 1.
Figure 4:
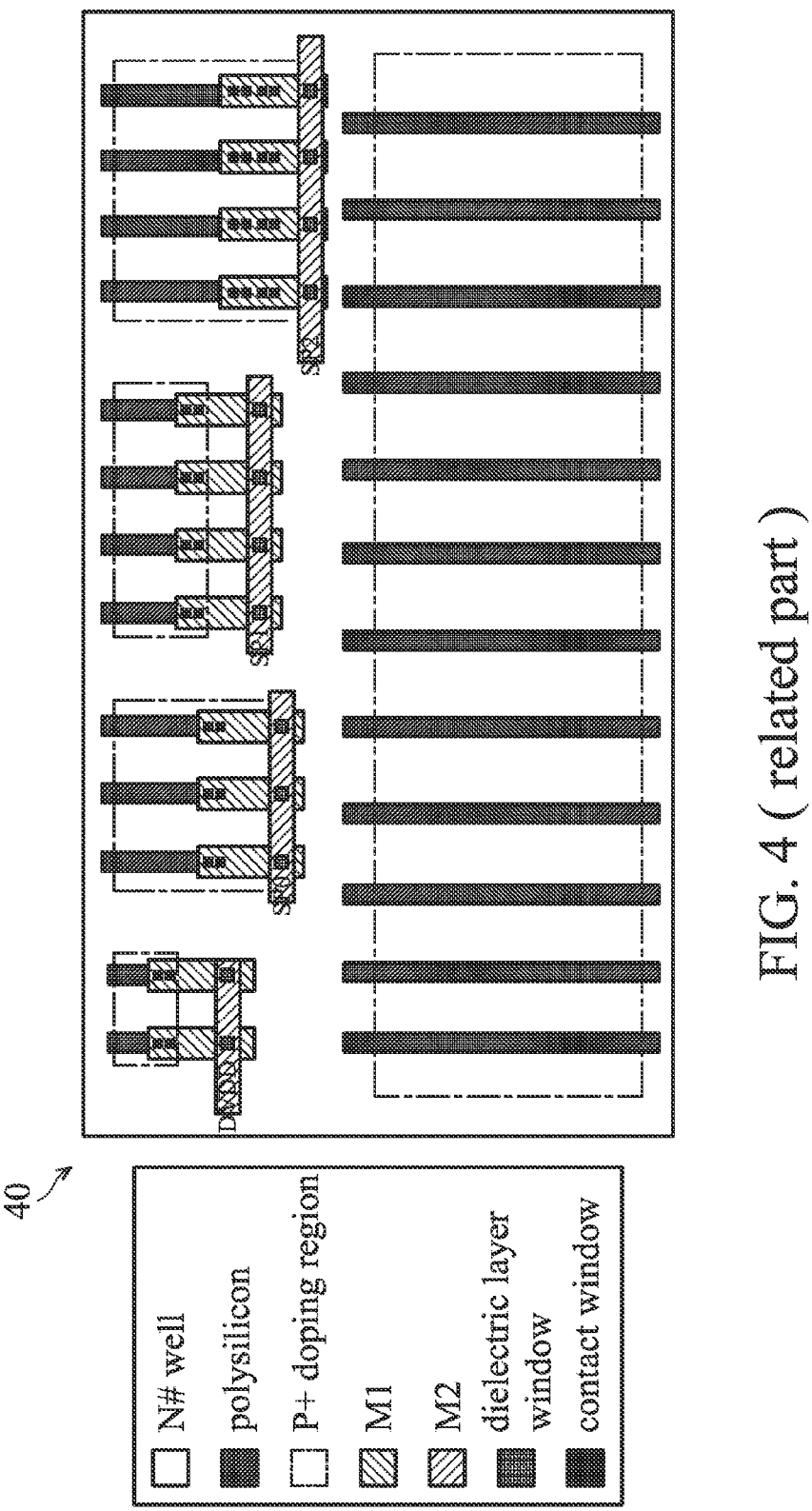
FIG. 4 shows a partial circuit layout of the fine delay unit in FIG. 2.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Figure 5:
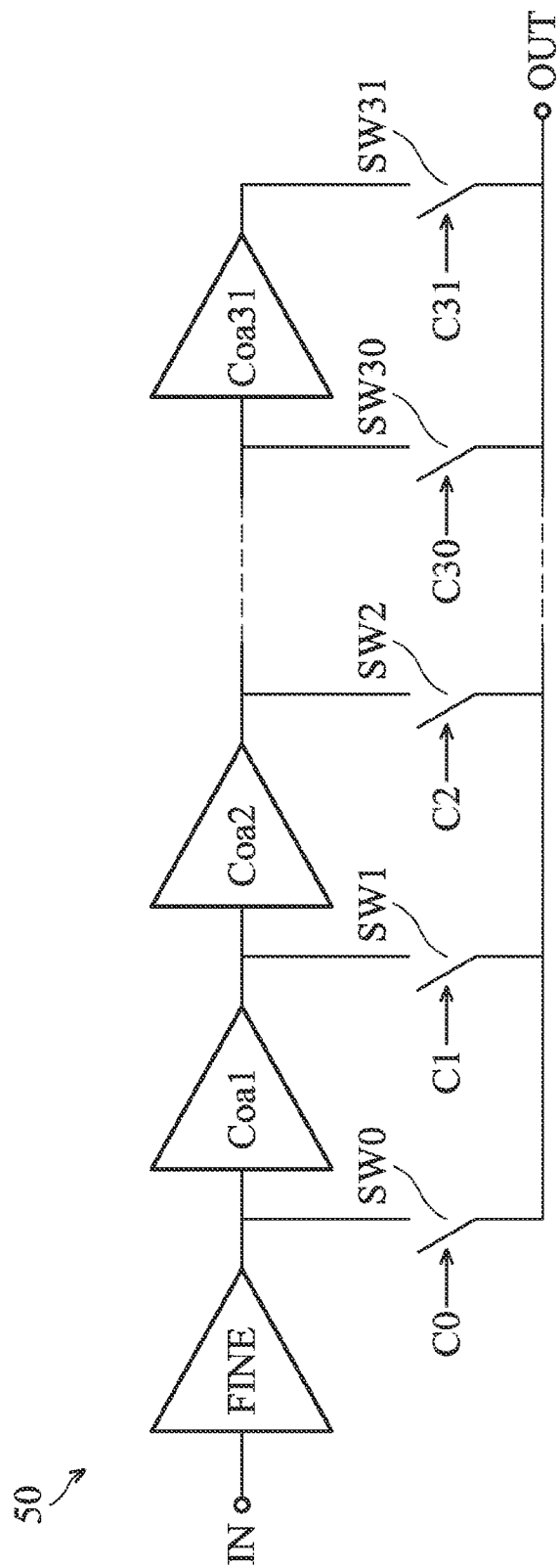
FIG. 5 shows an exemplary embodiment of a delay line circuit.

FIG. 5 shows an exemplary embodiment of a delay line circuit 50. As shown in FIG. 5, the delay line circuit 50 comprises a fine delay unit FINE, coarse delay units Coa1~Coa31, and switches SW0~SW31. An input terminal IN is coupled to an input terminal of the fine delay unit FINE. An output terminal of the fine delay unit FINE is coupled to the coarse delay unit Coa1. The coarse delay units Coa1~Coa31 are coupled together in series. The switch SW0 is coupled between the output terminal of the fine delay unit FINE and an output terminal OUT. Switch control signals C0~C31 are used to control the thirty-two (32) switches SW0~SW31 to be turned on or off, wherein only one switch is turned on every time. In the embodiment, there are four sets of codes of a control signal input to the fine delay unit FINE, and there are 32 bits in the switch control signals C0~C31. Thus, the delay circuit 50 of the embodiment can achieve a delay adjustment with 127 delay steps (4×32−1=127). The delay of each coarse delay unit CoaN is equal to that of the other coarse delay units and is four times the delay step of the fine delay unit FINE.

Figure 6A:
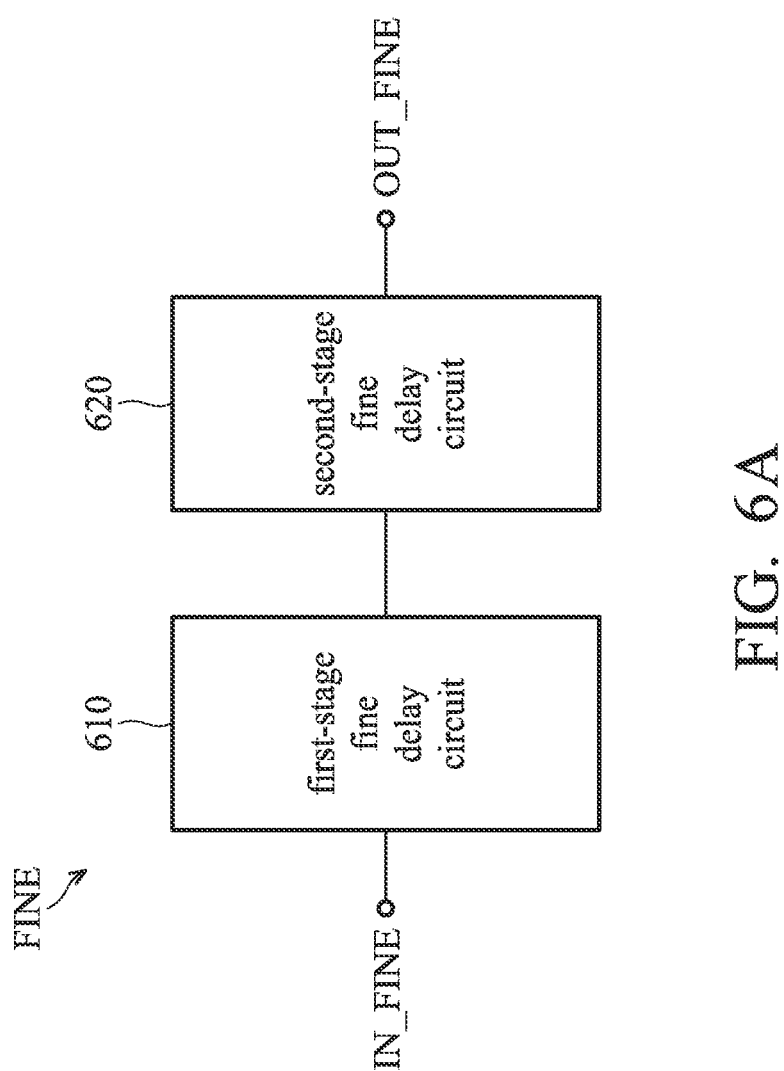
FIG. 6A shows an exemplary embodiment of a fine delay unit of the delay line circuit in FIG. 5.

FIG. 6A shows an exemplary embodiment of the fine delay unit FINE of the delay line circuit 50. As shown in FIG. 6A, the fine delay unit FINE comprises a first-stage fine delay circuit 610 and a second-stage fine delay circuit 620 whose structures are similar. The input terminal IN_FINE of the fine delay unit FINE is coupled to an input terminal of the first-stage fine delay circuit 310. An output terminal of the first-stage fine delay circuit 310 is coupled to an input terminal of the second-stage fine delay circuit 320. An output terminal of the second-stage fine delay circuit 320 is coupled to the output terminal OUT_FINE of the fine delay unit FINE.

Figure 6B:
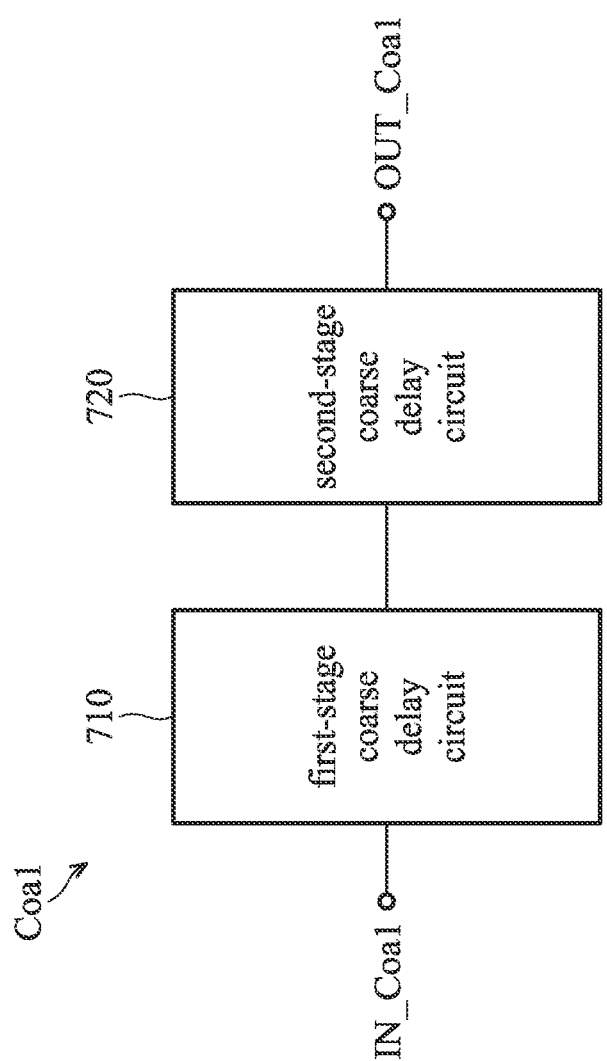
FIG. 6B shows an exemplary embodiment of a coarse delay unit of the delay line circuit in FIG. 5.

FIG. 6B shows an exemplary embodiment of the coarse delay unit Coa1 of the delay line circuit 50. The structures of the coarse delay units Coa2~Coa31 are the same as that of the coarse delay unit Coal, thus, the related description is omitted here. As shown in FIG. 6B the coarse delay unit Coal comprises a first-stage coarse delay circuit 710 and a second-stage coarse delay circuit 720 whose structures are similar. The input terminal IN_Coal of the coarse delay unit Coal is coupled to an input terminal of the first-stage coarse delay circuit 710. An output terminal of the first-stage coarse delay circuit 710 is coupled to an input terminal of the second-stage coarse delay circuit 720. An output terminal of the second-stage coarse delay circuit 720 is coupled to the output terminal OUT_Coal of the coarse delay unit Coal.

Figure 7:
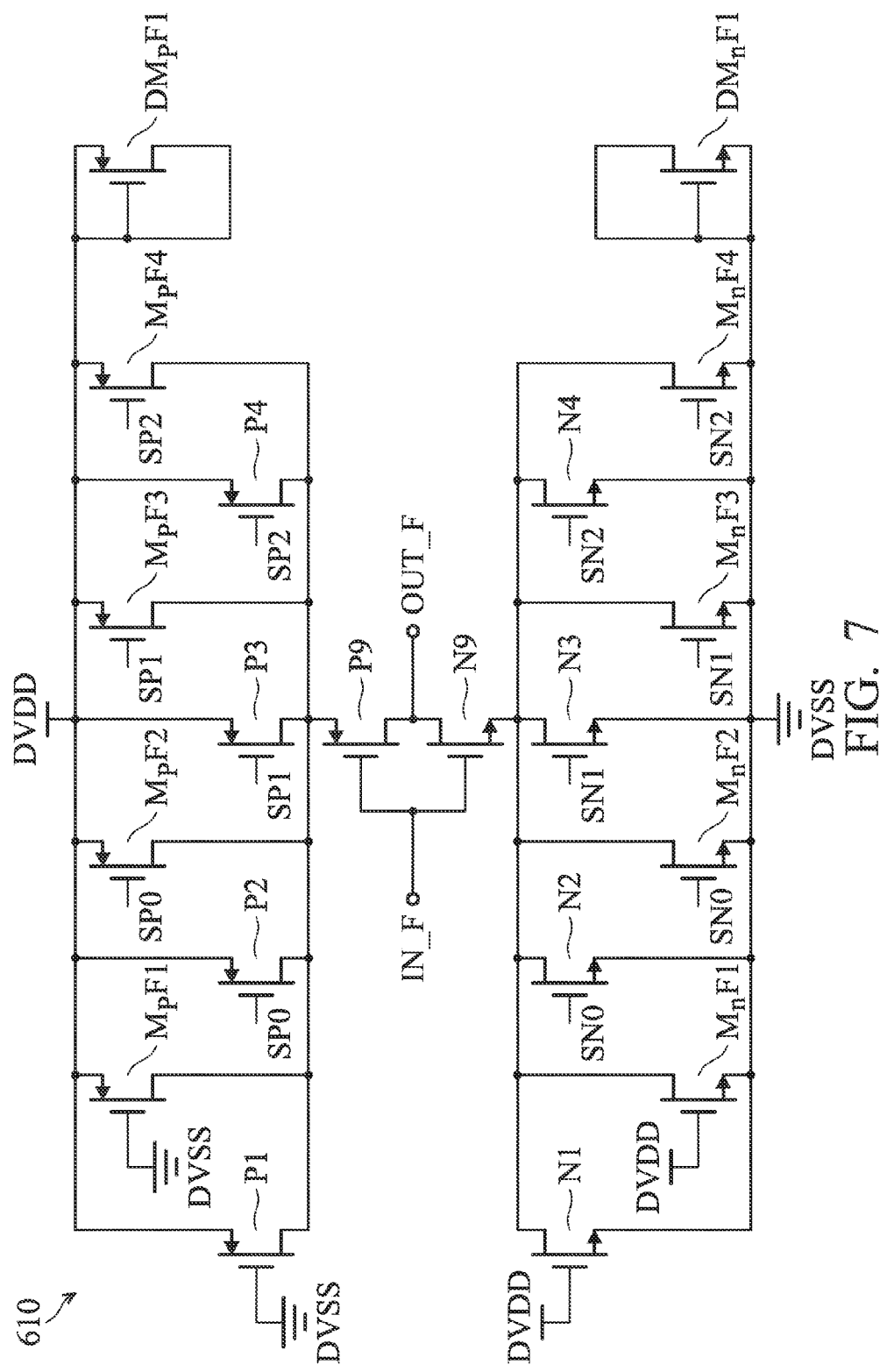
FIG. 7 shows an exemplary embodiment of a first-stage fine delay unit of the fine delay unit in FIG. 6A.

FIG. 7 shows an exemplary embodiment of the first-stage fine delay circuit 610. The structure of the second-stage fine delay circuit 610 is the same as that of the first-stage fine delay circuit 620, thus, the related description is omitted here. The first-stage fine delay unit 610 comprises PMOS transistors P1~P4 and P9, fine PNOS transistors MpF1~MpF4, a dummy fine PMOS transistor DMpD1, NMOS transistors N1~N4 and N9, fine NMOS transistors MnF1~MnF4, and a dummy fine NMOS transistor DMnF1.

Gates of the PMOS transistor P9 and the NMOS transistor N9 are coupled to the input terminal IN_F of the first-stage delay circuit 610. Drains of the PMOS transistor P9 and the NMOS transistor N9 are coupled to the output terminal OUT_F of the first-stage fine delay circuit 610. Sources of the PMOS transistors P1~P4 and the fine PMOS transistors MpF1~MpF4 are coupled to a ground voltage DVSS. Drains of the PMOS transistors P1~P4 and the fine PMOS transistors MpF1~MpF4 are coupled to a source of the PMOS transistor P9. Gates of the PMOS transistor P1 and the fine PMOS transistor MpF1 are coupled to the ground voltage DVSS. Gate of the PMOS transistor P2 and the fine PMOS transistor MpF2 are coupled to a control signal SP0. Gate of the PMOS transistor P3 and the fine PMOS transistor MpF3 are coupled to a control signal SP1. Gates of the PMOS transistor P4 and the fine PMOS transistor MpF4 are coupled to a control signal SP2. A gate, a drain, and a source of the dummy fine PMOS transistor DMpF1 are coupled to a power voltage DVDD.

Sources of the NMOS transistors N1~N4 and the fine NMOS transistors MnF1~MnF4 are coupled to the ground voltage DVSS. Drains of the NMOS transistors N1~N4 and the fine NMOS transistors MnF1~MnF4 are coupled to a source of the NMOS transistor N9. Gates of the NMOS transistor N1 and the fine NMOS transistor MnF1 are coupled to the power voltage DVDD. Gates of the NMOS transistor N2 and the fine NMOS transistor MnF2 are coupled to a control signal SN0. Gate of the NMOS transistor N3 and the fine NMOS transistor MnF3 are coupled to a control signal SN1. Gate of the NMOS transistor N4 and the fine NMOS transistor MnF4 are coupled to a control signal SN2. A gate, a drain, and a source of the dummy fine NMOS transistor DMnF1 are coupled to a ground voltage DVSS.

The fine PMOS transistors MpF1~MpF4 and the fine NMOS transistors NnF1~NnF4 are the transistors for fine delay steps. FIG. 7 shows four fine PMOS transistors and four fine NMOS transistors, however, without limitation. In practice, the number of fine PMOS transistors and the number of fine NMOS transistors can be increased or decreased according to requirements. The dummy fine PMOS transistor DmpFl and the dummy fine NMOS transistor DMnFl are applied to increase or decrease the of fine PMOS transistors and the number of fine NMOS transistors can be increased or decreased according to requirements. For example, when the number of fine PMOS transistors is required to be increased, the drain of the dummy fine PMOS transistor DMpF1 switches to be coupled to the sources of the PMOS transistors P1~P4, and the gate of the dummy fine PMOS transistor DMpF1 switches to be coupled to the gate of one PMOS transistors, among the PMOS transistors P1~P4, which is desired to be adjusted.

The widths of the first gate features of the PMOS transistors P1~P4 are equal, however, the number of first gate features of one PMOS transistor can be different from that of the other PMOS transistors. In the embodiment, the width of the gate features of the transistor is the finger width. One large transistor can be divided into several small transistors. For example, a transistor whose width is 10 u. In order to reduce the junction area of the source-drain of the transistor and form ten fingers by the gate transistor of the transistor, the width of each finger is equal to 10 um. In the following, the PMOS transistors P1~P4 are referred to as coarse delay PNOS transistors. Since the widths of the first gate features of the PMOS transistors P1~P4, an active region (also referred to as an oxide defined region 'OD region) can be shared, thereby lowering the parasitical voltages of the drains of the transistors. However, in this case, there is an integer ratio between the sizes of the PMOS transistors P1~P4. In practice, in order to uniform the delay step, the ratio between the sizes of the PMOS transistors which are coupled to the source of the PMOS transistor P and controlled by the ground voltage DVSS and the control signals SP0~SP2 is not an integer ratio. The PMOS-end of the first-stage fine delay circuit 610 is given as an example. The ratio of the equivalent widths of the four PMOS transistors whose gates are coupled to the ground voltage DVSS, the control signal SP0, the control signal SP1, and the control signal SP2 is 4:0.5:2:6. In cases where the active region is shared, to accomplish the above ratio of the equivalent widths, twenty-five (4×2+0.5×2+2×2+6×2=25) first gate features with the same width may be required, which increases the parasitical capacitor and the circuit area, and the advantage of the OD share is lost. In the embodiment, the fine PMOS transistors MpF1—MpF4 are applied to adjust the ratio of the equivalent widths of the coarse PMOS transistors P1~P4, and the widths of the second gate features of all the fine PMOS transistors are equal however they are smaller than the ratio of the equivalent widths of first gate features of the coarse PMOS transistors P1~P4. According to the example, in the case of the ratio of the equivalent widths of the four PMOS transistors whose gates are coupled to the ground voltage DVSS, the control signal SP0, the control signal SP1, and the control signal SP2 is 4:0.5:2:6, the widths of the second features of the fine PMOS transistors can be set as ½ of the widths of the first features of the coarse PMOS transistors, such that the four PMOS transistors whose gates are coupled to the ground voltage DVSS, the control signal SP0, the control signal SP1, and the control signal SP2 have four (4) first gate features, no (0) first gate feature, two (2) first gate features, and six (6) first gate features, respectively, thereby achieving a ratio of the equivalent widths of 4:0.5:2:6. Thus, only twelve (4+0+2+6=12) first gate features are required. Compared with the above 25 first gate features, the number of first gate features in the OD region can be decreased, which is advantageous to the circuit layout.

Figure 9:
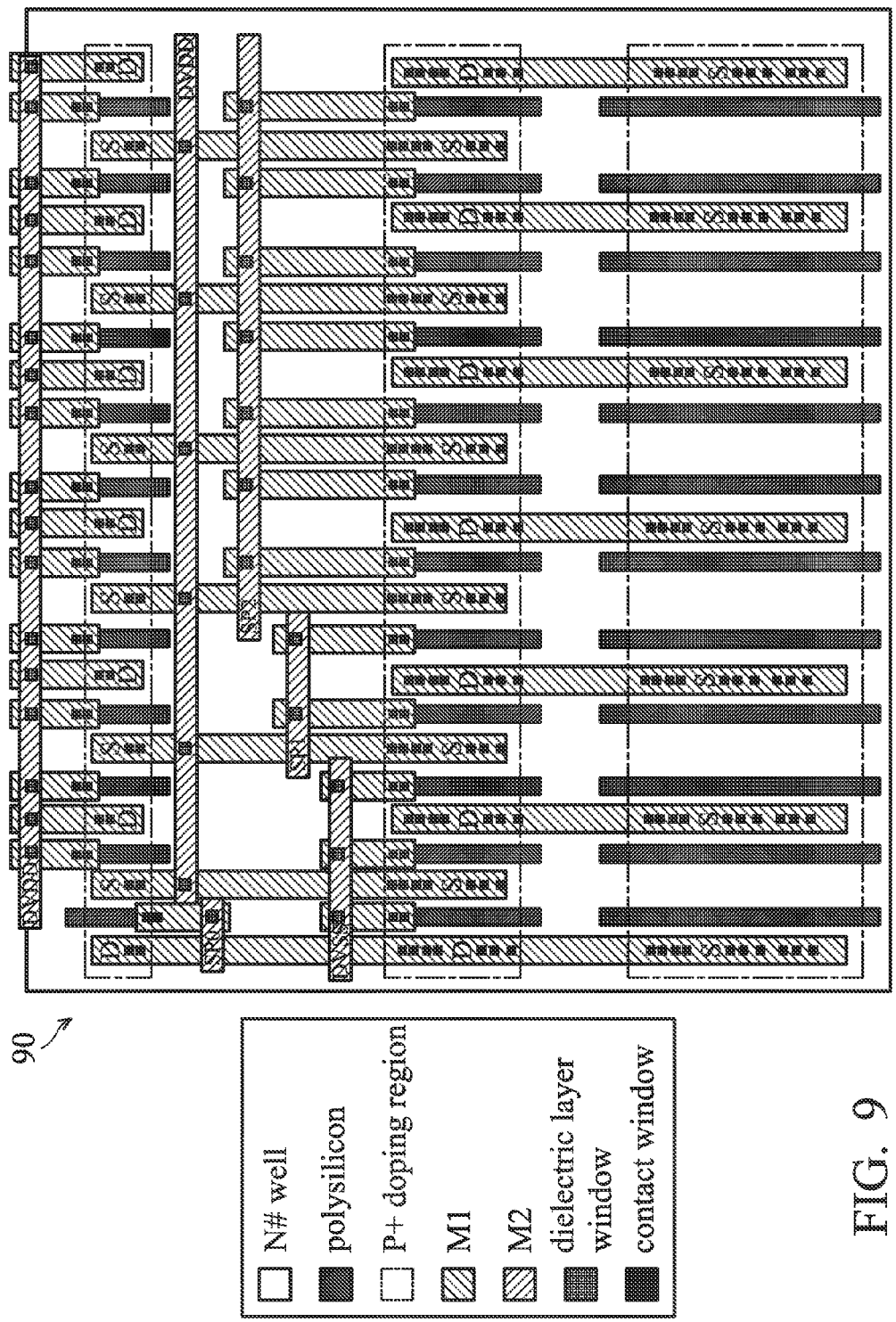
FIG. 9 shows a partial circuit layout of the first-stage fine delay unit.

FIG. 9 an exemplary embodiment of a partial circuit layout 90 of the first-stage fine delay circuit of the fine delay unit. As shown in FIG. 9, the circuit layout 90 represents only the PMOS-end of the first-stage fine delay circuit. Since the circuit layout of the NMOS-end of the first-stage fine delay circuit is similar to that of the PMOS-end, only the circuit layout of the PMOS-end of the first-stage fine delay circuit is shown for clear illustration. In FIG. 9, the P+ doping region on the top corresponds to the active region of the fine PMOS transistors, the P+ doping region on the middle corresponds to the active region of the coarse PMOS transistors, and the P+ doping region on the bottom corresponds to the active region of the PMOS transistors coupled to the input terminal and the output terminal, such as the PMOS transistor P9 in FIG. 7. The number of second gate features of the fine PMOS transistors (that is the number of polysilicon gate features of the P+ doping region on the top) is equal to the number of first gate features of the coarse PMOS transistors (that is the number of polysilicon gate features of the P+ doping region on the middle). The second features, sources, and drains of the fine PMOS transistors which are not used are coupled to the power voltage DVDD to serve as the dummy fine PMOS transistors. The widths of the second gate features of the fine PMOS transistors are smaller than the widths of the first gate features of the coarse PMOS transistors. In an example, the widths of the second gate features of the fine PMOS transistors are equal to ½ of the widths of the first gate features of the coarse PMOS transistors. In another example, the widths of the second gate features of the fine PMOS transistors are equal to 1/10 of the widths of the first gate features of the coarse PMOS transistors. However, the above multiple can be adjusted according to real requirements. When it is required to adjust the delay step by using the fine PMOS transistors, the drains of the fin PMOS transistors are coupled to the drains of the coarse PMOS transistors, and the corresponding second gate features are coupled to the ground voltage DVSS or control signals SP0~SP2. In the circuit layout 90 shown in FIG. 9, one second gate feature is coupled to the control signal SP0, and the drain corresponding to this second gate feature is coupled to the drain of the corresponding coarse PMOS transistor. Three gate features of the first gate features are coupled to the ground voltage DVSS, two first gate features is coupled to the control signal SP1, and seven first gate features are coupled to the control signal SP2. It is assumed that the widths of the second gate features are equal to ½ of the widths of the first gate feature. In the circuit layout 90 of FIG. 9, the ratio of the equivalent widths of the four PMOS transistors which are coupled between the power voltage DVDD and the source of the PMOS transistor and whose gates are coupled to the ground voltage DVSS, the control signal SP0, the control signal SP1, and the control signal SP2, respectively, is 3:0.5:2:7. According to FIG. 9, the widths of the gate features on the different rows are the same. This design is suitable for the 28 nm processes or advanced processes. Also according to FIG. 9, the circuit layout of FIG. 9 is presented as a square, which makes it easy to apply the design of the embodiment to different system chip layouts when it is desirable to use the same delay unit module. In the current technique, the shapes of the delay line modules are rectangles. However, to apply the current technique to different system chip layouts, a different circuit layout has to be designed.

Figure 8:
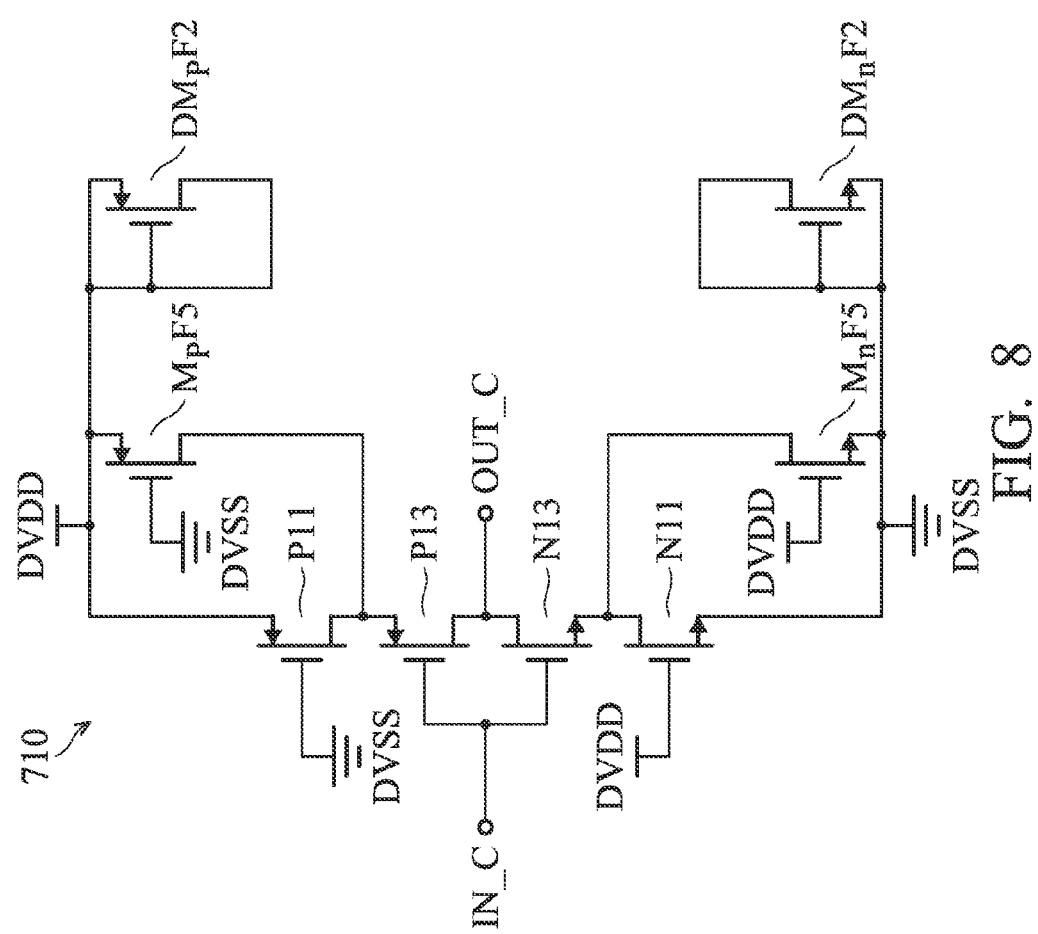
FIG. 8 shows an exemplary embodiment of a first-stage coarse delay unit of the coarse delay unit in FIG. 6B.

FIG. 8 shows an exemplary embodiment of the first-stage course delay circuit 710 of the coarse delay unit Coal in FIG. 6B. The second-stage coarse delay circuit 720 is the same as the first-stage coarse delay circuit 710, thus omitting the related description. The first-stage coarse delay circuit 710 comprises PMOS transistors P11 and P13, a fine PMOS transistor MPF5, a dummy fine PMOS transistor DMpF2, NMOS transistors N11 and N13, a fine NMOS transistor MnF5, and a dummy fine transistor NMnF2.

Gates of the PMOS transistor P13 and the NMOS transistor N13 are coupled to the input terminal IN_C of the first-stage coarse delay circuit 710. Drains of the PMOS transistor P13 and the NMOS transistor N13 are coupled to the output terminal OUT_C of the first-stage coarse delay circuit 710. Sources of the PMOS transistor P11 and the fine PMOS transistor MpF5 are coupled to the ground voltage DVSS. Drains of the PMOS transistor P11 and the fine PMOS transistor MpF5 are coupled to a source of the PMOS transistor P13. Gates of the PMOS transistor P11 and the fine PMOS transistor MpF5 are coupled to the ground voltage DVSS A gate, a drain, and a source of the dummy fine PMOS transistor DMpf5 are coupled to the power voltage DVDD.

Sources of the NMOS transistor N11 and the fine NMOS transistor MnF5 are coupled to the ground voltage DVSS. Drains of the NMOS transistor N11 and the fine NMOS transistor MnF5 are coupled to a source of the NMOS transistor N13. Gates of the NMOS transistor N11 and the fine NMOS transistor MnF5 are coupled to the power voltage DVDD. A gate, a drain, and a source of the dummy fine NMOS transistor DMnf2 are coupled to the ground voltage DVSS.

Similar to the first-stage fine delay circuit 610. The PMOS transistor P11 is also referred to as a coarse PMOS transistor. The width of the first gate feature of this coarse PMOS transistor is larger than the width of the second gate feature of the fine PMOS transistor. The ratio of the equivalent width of the fine PMOS transistor P11 can be adjusted by applying the fine PMOS transistor. FIG. 8 shows one fine PMOS transistor and the NMOS transistor, however, without limitation. The number of the fine PMOS transistor and the number of the fine NMOS transistor can be increased or decreased flexibly. The dummy fine PMOS transistor DMpF2 and the dummy fine NMOS transistor DMnF2 represent the fine PMOS transistor and the fine NMOS transistor whose numbers can be increased or decreased flexibly according to the system requirements. For example, when the number of fine NMOS transistor is increased, the drain of the dummy fine PMOS transistor DMpF2 is coupled to the drain of the PMOS transistor P11, and the gate of the dummy fine PMOS transistor DMpF2 is coupled to the ground voltage DVSS. The circuit layout of the first-stage coarse delay circuit 710 is similar to the circuit layout of the first-stage fine delay circuit 610, and can be referred to in the circuit layout 90 in FIG. 9, thus the related description is omitted for brevity.

In the above embodiment, the circuit layout at the PMOS-end terminal is given as an example for illustration. The circuit layout at the NMOS-end terminal is similar to that at the PMOS-end terminal, thus, omitting the related description. One skilled in the art can understand the circuit layout of the NMOS-end terminal according to the circuit layout of the PMOS-end terminal.

Figure 10:
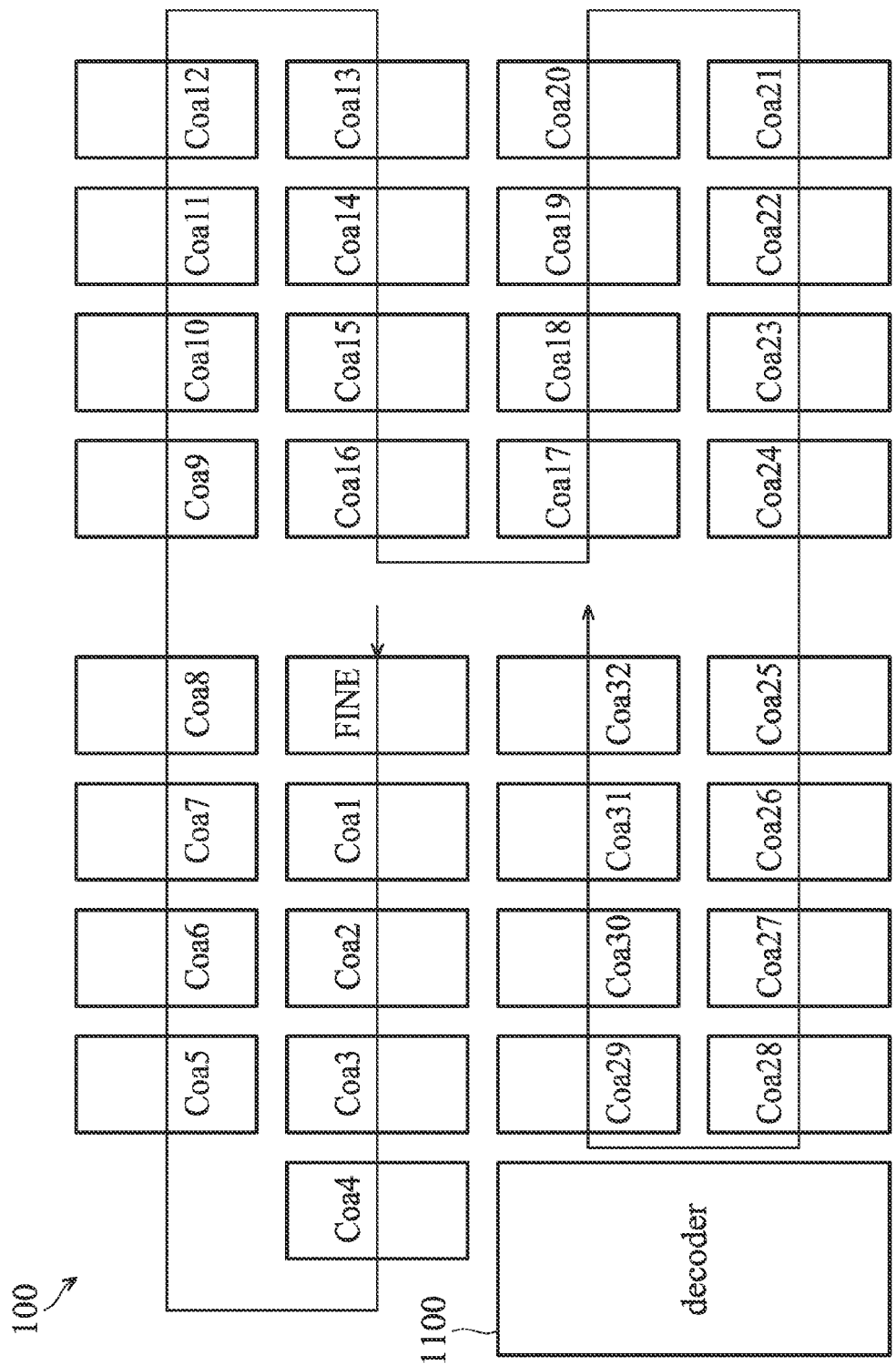
FIG. 10 shows an exemplary embodiment of a delay circuit module.

FIG. 10 shows an exemplary embodiment of a delay circuit module 100. As described above, by applying the fine PMOS transistor and the fine NMOS transistor, the number of gate features of the coarse PMOS transistors and the coarse PMOS transistors can be decreased, and the widths of the circuit layouts of the fine delay unit FINE and the coarse delay units Coa1~Coa31 can be decreased. The fine delay unit FINE and the coarse delay units Coa1~Coa31 are arranged in the same direction, as shown in FIG. 10, such that the circuit of the delay circuit module 100 is presented as a square. The arrow shown in FIG. 10 represents the connection of the signal lines and the signal transmission directions. The coarse delay units (such as the coarse delay unit Coa12) which are disposed at the corners are connected to longer metal lines, which can be compensated for by increasing the number of fine transistors in the coarse delay units at the corners. For example, the gate of the dummy fine PMOS transistor is coupled to the ground voltage DVSS and the drain thereof is coupled to the drain of the coarse PMOS transistor, or the number of input gate features of the fine PMOS transistor is increased.

An exemplary embodiment of a semiconductor integrated circuit is further provided. The semiconductor integrated circuit comprises a plurality of core transistors and a circuit module. Gate features of the core transistors are arranged in parallel. The circuit module comprises a plurality of semiconductor devices. The semiconductor devices are arranged in same direction, and a circuit layout of the circuit module is presented as a square. Each the semiconductor devices comprises a substrate, n N-type well, a first active region, a plurality of first sources, a plurality of first drains, plurality of first gate features, a second active region, a plurality of second sources, plurality second drains, and a plurality of second gate features. The N-type well is disposed on the substrate. The first active region is disposed in the N-type well. The first sources are formed in the first active region. The first drains are formed in the first active region. Each first gate feature is disposed on the first active region between one of the first sources and one of the first drains, and the first gate features are arranged in parallel. The second active region is disposed in the N-type well and parallels the first active region. The second sources are formed in the second active region. The second drains are formed in the second active region. Each second gate feature is disposed on the second active region between one of the second sources and one of the second drains, and the second gate features are arranged in parallel. Widths of the first gate features are larger than widths of the second gate features.

Each semiconductor device further comprises a P-type well, a third active region, a plurality of third sources, a plurality of third drains, a plurality of third gate features, a fourth region, a plurality of fourth sources, a plurality of fourth drains, and a plurality of fourth gate features. The P-type well is disposed on the substrate. The third active region is disposed in the P-type well. The third sources are formed in the third active region. The third drains are formed in the third active region. Each third gate feature is disposed on the third active region between one of the third sources and one of the third drains, and the third gate features are arranged in parallel. The fourth region is disposed in the P-type well and parallels the third active region. The fourth sources are formed in the fourth active region. The fourth drains are formed in the fourth active region. Each fourth gate feature is disposed on the fourth active region between one of the fourth sources and one of the fourth drains, and the fourth gate features are arranged in parallel. Widths of the third gate features are larger than widths of the fourth gate features.

Through the square circuit layout of the circuit module, the circuit module can be applied in any position in SOC layouts flexibly, particularly, for 28 nm processes or advanced processes.

In an embodiment, the above circuit module is implemented by a delay line circuit module, which is the delay line circuit of the above embodiment. The semiconductor devices comprise one fine delay unit and a plurality of coarse delay units as described in the above embodiment.

According to above embodiments, the circuit module with a square circuit layout can be disposed in SOCs flexibly, thereby shortening the design period. Moreover, the delay line circuits with the square circuit layout can ensure the uniform delay steps and degrade the effect of the temperature and voltage.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A delay line circuit comprising:
   a fine delay unit having an input terminal coupled to an input terminal of the delay line circuit and an output terminal coupled to an output terminal of the delay line circuit through a switch; and
   a coarse delay unit coupled to the output terminal of the fine delay unit in series, wherein the coarse delay unit is coupled to the output terminal of the delay line circuit through a corresponding one of a plurality of first switches,
   wherein the fine delay unit comprises a fine delay circuit, and the fine delay circuit comprises:
      a first PMOS transistor;
      a plurality of second PMOS transistors coupled between a power voltage and a source of the first PMOS transistor in parallel, wherein widths of gate features of the second PMOS transistor are equal;
      at least one third PMOS transistor coupled between the power voltage and the source of the first PMOS transistor, wherein a width of gate features of the at least one third PMOS transistor is smaller than the widths of the gate features of the second PMOS transistors;
      a second NMOS transistor;
      a plurality of second NMOS transistors coupled between a ground voltage and a source of the first NMOS transistor, wherein widths of gate features of the second NMOS transistors are equal; and
      at least one third NMOS transistor coupled between the ground voltage and the source of the first NMOS transistor, wherein a width of gate features of the at least one third NMOS transistor is smaller than the widths of the gate features of the second NMOS transistors.

2. The delay line circuit as claimed in claim 1, wherein delay of the coarse delay unit is equal to a positive integer multiple of a delay step of the fine delay unit.

3. The delay line circuit as claimed in claim 2, wherein each coarse delay unit comprises two coarse delay circuits, and each coarse delay units of at least one of the coarse delay units comprises:
   a fourth PMOS transistor;
   a fourth NMOS transistor having a drain coupled to a drain of the fourth PMOS transistor and a gate coupled to a gate of the fourth PMOS transistor;
   a fifth PMOS transistor coupled between the power voltage and a source of the fourth PMOS transistor;
   at least one sixth PMOS transistor coupled between the power voltage and the source of the fourth PMOS transistor, wherein a width of gate features of the at least one sixth PMOS transistor is smaller than a width of gate features of the fifth PMS transistor;

a fifth NMOS transistor coupled between the ground voltage and the source of the fourth NMOS transistor; and at least one sixth NMOS transistor coupled between the ground voltage and the source of the fourth NMOS transistor, wherein a width of gate features of the at least one six NMOS transistor is smaller than a width of gate features of the fifth NMOS transistor.

4. The delay line circuit as claimed in claim 3, wherein a gate of the fifth PMOS transistor and a gate of the at least one sixth PMOS transistor are coupled to the power voltage, and a gate of the fifth NMOS transistor and a gate of the at least one sixth NMOS transistor are coupled to the ground voltage.

5. The delay line circuit as claimed in claim 1, wherein a circuit layout of the delay line circuit is presented as a square.

6. The delay line circuit as claimed in claim 1
wherein a gate of one of the second PMOS transistors is coupled to the power voltage, and gates of the other of the second PMOS transistors are coupled to a controller,
wherein a gate of the at least one third PMOS transistor is coupled to the controller,
wherein a gate of one of the second NMOS transistors is coupled to the ground voltage, and gates of the other of the second NMOS transistors are coupled to the controller, and
wherein a gate of the at least one third NMOS transistor is coupled to the controller.

7. A semiconductor integrated circuit comprising:
a plurality of core transistors, wherein gate features of the core transistors are arranged in parallel; and
a circuit module comprising a plurality of semiconductor devices, wherein the semiconductor devices comprises:
a substrate;
an N-type well disposed on the substrate;
a first active region disposed in the N-type well;
a plurality of first sources formed in the first active region;
a plurality of first drains formed in the first active region;
a plurality of first gate features, wherein each first gate feature is disposed on the first active region between one of the first sources and one of the first drains, and the first gate features are arranged in parallel;
a second active region disposed in the N-type well and paralleling the first active region;
a plurality of second sources formed in the second active region;
a plurality of second drains formed in the second active region; and
a plurality of second gate features, wherein each second gate feature is disposed on the second active region between one of the second sources and one of the second drains, and the second gate features are arranged in parallel,
wherein widths of the first gate features are larger than widths of the second gate features.

8. The semiconductor integrated circuit as claimed in claim 7, wherein each semiconductor device further comprises:
a P-type well disposed on the substrate;
a third active region disposed in the P-type well;
a plurality of third sources formed in the third active region;
a plurality of third drains formed in the third active region;
a plurality of third gate features, wherein each third gate feature is disposed on the third active region between one of the third sources and one of the third drains, and the third gate features are arranged in parallel;
a fourth region disposed in the P-type well and paralleling the third active region;
a plurality fourth sources formed in the fourth active region;
a plurality fourth drains formed in the fourth active region; and
a plurality of fourth gate features, wherein each fourth gate feature is disposed on the fourth active region between one of the fourth sources and one of the fourth drains, and the fourth gate features are arranged in parallel,
wherein widths of the third gate features are larger than widths of the fourth gate features.

9. The semiconductor integrated circuit as claimed in claim 8, wherein the circuit module is implemented by a delay line circuit module,
wherein the semiconductor devices comprises a fine delay unit and a plurality of coarse delay units, the semiconductor circuit further comprise a signal line, and the signal line couples the fine delay unit and the coarse delay units in series,
wherein an input terminal of the delay line circuit module is coupled to an input terminal of the fine delay unit, and
wherein an output terminal of each of the fine delay unit and the coarse delay units is coupled to an output terminal of the delay line circuit module through a switch.

10. The semiconductor integrated circuit as claimed in claim 9, wherein a delay of each coarse delay unit is equal to a positive integer multiple of a delay step of the fine delay unit.

11. The semiconductor integrated circuit as claimed in claim 10, wherein the line delay unit comprises two fine delay circuits, and each fine delay circuit comprises:
a first P-type metal oxide semiconductor (PMOS) transistor;
a first N-type metal oxide semiconductor (NMOS) transistor having a drain coupled to a drain of the first PMOS transistor and a gate coupled to a gate of the first PMOS transistor;
a plurality of second PMOS transistors coupled between a power voltage and a source of the first PMOS transistor in parallel, wherein each second PMOS transistor comprises at least one of the first gate features;
at least one third PMOS transistor coupled between the power voltage and the source of the first PMOS transistor, wherein the at least one third PMOS transistor comprises at least one of the second gate features;
a plurality of second NMOS transistors coupled between a ground voltage and a source of the first NMOS transistor, wherein each second NMOS transistor comprises at least one of the third gate features; and
at least one third NMOS transistor coupled between the ground voltage and the source of the first NMOS transistor, wherein the at least one third PMOS transistor comprises at least one of the fourth gate features.

12. The semiconductor integrated circuit as claimed in claim 11,
wherein a gate of one of the second PMOS transistors is coupled to the power voltage, and gates of the other of the second PMOS transistors are coupled to a controller,
wherein a gate of the at least one third PMOS transistor is coupled to the controller,
wherein a gate of one of the second NMOS transistors is coupled to the ground voltage, and gates of the other of the second NMOS transistors are coupled to the controller, and wherein a gate of the at least one third NMOS transistor is coupled to the controller.

13. The semiconductor integrated circuit as claimed in claim 10, wherein each coarse delay unit comprises two coarse delay circuits, and each coarse delay unit of at least one of the coarse delay units comprises:

a first PMOS transistor;

a first NMOS transistor having a drain coupled to a drain of the first PMOS transistor and a gate coupled to a gate of the first PMOS transistor;

a second PMOS transistor coupled between a power voltage and a source of the first PMOS transistor, wherein the second PMOS transistor comprises at least one of the first gate features;

at least one third PMOS transistor coupled between the power voltage and the source of the first PMOS transistor, wherein the at least one third PMOS transistor comprises at least one of the second gate features;

a second NMOS transistor coupled between a ground voltage and the source of the first NMOS transistor, wherein the second NMOS transistor comprises at least one of the third gate features; and at least one third NMOS transistor coupled between the ground voltage and the source of the first NMOS transistor, wherein the at least third NMOS transistor comprises at least one of the fourth gate features.

14. The semiconductor integrated circuit as claimed in claim 13, wherein a gate of the second PMOS transistor and a gate of the at least one third PMOS transistor are coupled to the power voltage, and a gate of the second NMOS transistor and a gate of the at least one third NMOS transistor are coupled to the ground voltage.

* * * * *